(12) United States Patent
Nitta et al.

(10) Patent No.: US 6,784,054 B2
(45) Date of Patent: Aug. 31, 2004

(54) METHOD OF MANUFACTURING SEMICONDUCTOR DEVICE

(75) Inventors: Toshinari Nitta, Kyoto (JP); Masatoshi Arai, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/241,492

(22) Filed: Sep. 12, 2002

(65) Prior Publication Data

US 2003/0049905 A1 Mar. 13, 2003

(30) Foreign Application Priority Data

Sep. 13, 2001 (JP) ........................................ 2001-277502

(51) Int. Cl.[7] .......................................... H01L 21/8247
(52) U.S. Cl. ...................................... 438/257; 438/258
(58) Field of Search ................................ 438/257–267, 438/593–594

(56) References Cited

U.S. PATENT DOCUMENTS

| | | | | |
|---|---|---|---|---|
| 4,775,642 A | * | 10/1988 | Chang et al. | 438/258 |
| 5,422,306 A | * | 6/1995 | Niwa et al. | 438/393 |
| 5,521,108 A | * | 5/1996 | Rostoker et al. | 438/260 |
| 6,103,576 A | * | 8/2000 | Deustcher et al. | 438/261 |
| 6,159,800 A | * | 12/2000 | Liu et al. | 438/258 |
| 6,387,784 B1 | * | 5/2002 | Chong et al. | 438/585 |

OTHER PUBLICATIONS

Y.S. Hisamune et al., "A 3.6 $\mu m^2$ Memory Cell Structure for 16MB EPROMS", IEEE, 1989, 25.2.1–25.2.4.

* cited by examiner

Primary Examiner—Richard A. Booth
(74) Attorney, Agent, or Firm—McDermott Will & Emery LLP (57) ABSTRACT

A first polysilicon film, an ONO film, and a second polysilicon film are deposited on a substrate. After ions of an impurity have been implanted in the second polysilicon film, a silicon oxide is deposited on the substrate, followed by a heat treatment for activating the impurity. Patterning is thereafter performed on the silicon oxide film, the second polysilicon film, the ONO film and the first polysilicon film to from stack cell electrodes and an on-gate protective film. The on-gate protective film formed of a silicon oxide film is densified to have improved resistance to etching. Therefore the desired shape of the on-gate protective film is maintained. The film thickness of sidewalls on side surfaces of the stack cell electrodes is set with stability, so that the reduction in insulation withstand voltage between a contact and a control gate electrode is limited.

12 Claims, 10 Drawing Sheets

METHOD OF MANUFACTURING SEMICONDUCTOR DEVICE

BACKGROUND OF THE INVENTION

Figure 10:
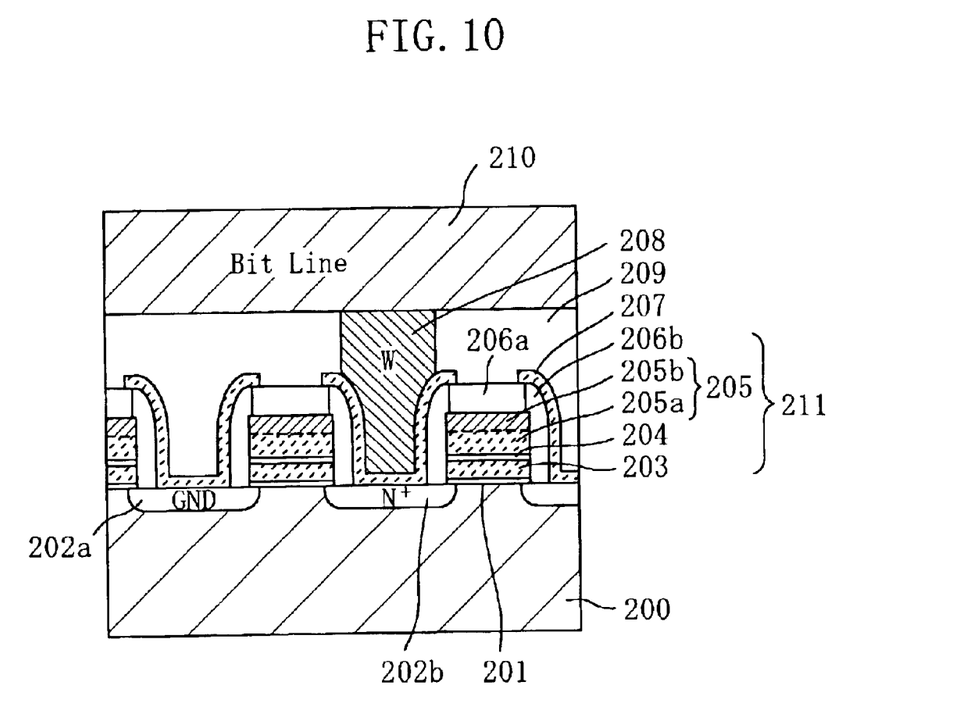
FIG. 10 is a cross-sectional view of the conventional stack-type nonvolatile semiconductor memory device disclosed in the document.

FIG. 10 is a cross-sectional view of a conventional stack-type nonvolatile semiconductor memory device disclosed in a document (IEDM 1989, pp583–586).

As shown in FIG. 10, the conventional nonvolatile semiconductor memory device has a tunnel insulating film 201 formed of a silicon substrate 200, source and drain regions 202a and 202b formed in the silicon substrate 200, stack cell electrodes 211 including a floating gate electrode 203 formed as a layer over the tunnel insulating film 201, an oxide-nitride-oxide (ONO) capacitor film 204 and a control gate electrode 205, a topside protective oxide film 206a formed over the stack cell electrodes 211, and an oxide film sidewall 206b formed on side surfaces of the topside protective oxide film 206a and the stack cell electrodes 211. The control gate electrode 205 has a lower electrode layer 205a formed of polysilicon and an upper electrode layer 205b made of a silicide. The nonvolatile semiconductor device has a memory cell transistor thus constructed.

An interlayer insulating film 209 formed of a silicon oxide film and a bit line 210 extending on the interlayer insulating film 209 are provided on the substrate. One of the source and drain regions 202a and 202b, i.e., the drain region 202b in this semiconductor device, is connected to the bit line 210 by a drain contact. The drain contact in this example of the conventional device is constituted by a contact pad 207 formed of a tungsten silicide on the drain region 202b, and a tungsten plug 208 extending through the interlayer insulating film 209 and connecting to the contact pad 207. The contact pad 207 and the stack cell electrodes 211 are electrically insulated from each other by the topside oxide film 206a and the oxide film sidewall 206b. The upper surface oxide film 206a on the control gate electrode 205 is also used as an etching hard mask when the stack cell electrodes 211 are formed by etching. The oxide film sidewall 206b is formed in such a manner that an oxide film formed by deposition is etched back by anisotropic etching so that the oxide film is left on the stack cell electrode 211 and the topside oxide film 206a.

Therefore the insulation withstand voltage between the stack cell electrodes 211 and the contact pad 207 is determined by the film thickness of the topside oxide film 206a and the film thickness of the oxide film sidewall 206b on the control gate electrode 205.

In the thus-constructed conventional semiconductor memory device, the contact pads 207 can be formed in a self-alignment manner in correspondence with the source and drain regions 202a and 202b. That is, there is no need to provide a margin for positioning between a mask for patterning the stack cell electrodes 211 and a mask for forming the contact holes in which the tungsten plugs 208 are embedded. Therefore the distance between the groups of stack cell electrodes 211 can be reduced. In other words, the margin for alignment of the contact holes in which the tungsten plugs 208 are embedded can be increased. For this reason in particular, this structure is suitable for semiconductor device processes of finer rule.

In the process of fabricating the stack-type nonvolatile semiconductor device, however, a plurality of cleaning steps are performed after formation of the topside oxide film 206a on the control gate electrode 205 and before deposition for forming the sidewall oxide film.

For example, resist separation and cleaning are performed after ion implantation for forming the source and drain regions, and cleaning is performed before deposition for forming the sidewall oxide film. The silicon oxide film or other materials exposed on the substrate are not substantially etched by one step for such cleaning. However, they are etched to some extent by a plurality of steps for such cleaning. That is, the exposed portion of the topside protective film 206a on the control gate electrode 204 is reduced by the plurality of cleaning steps.

Figure 9A:
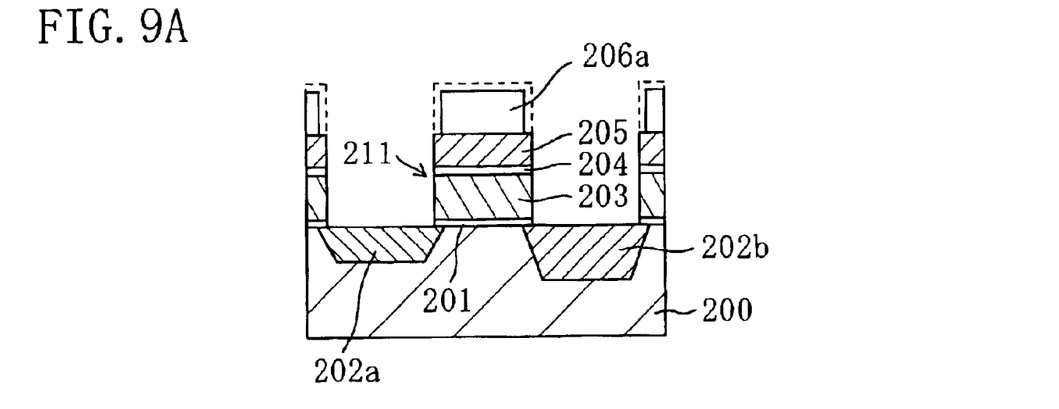
FIGS. 9A, 9B, and 9C are cross-sectional views showing steps for forming a semiconductor device described in a document by a conventional manufacturing method.
Figure 9B:
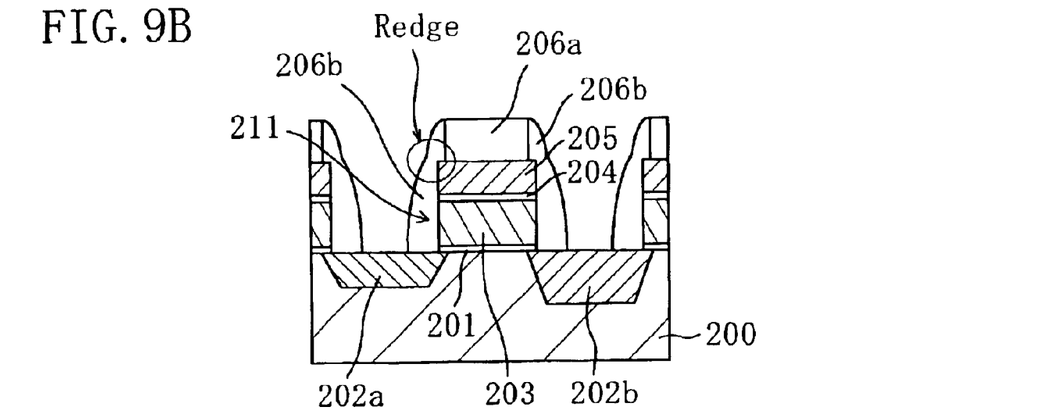
Figure 9C:
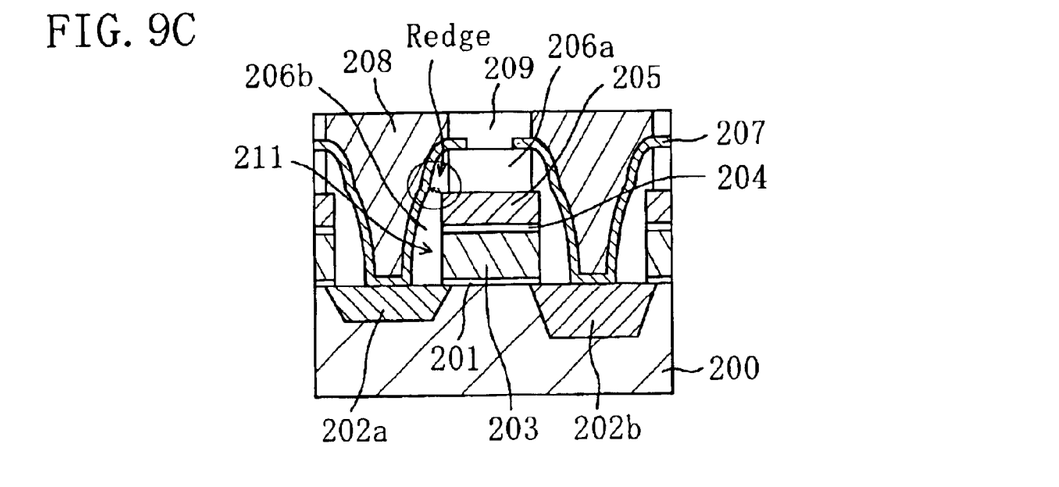

FIGS. 9A, 9B, and 9C are cross-sectional views showing steps of forming the semiconductor device described in the above-mentioned document. FIGS. 9A, 9B, and 9C show only steps after etching on the exposed portion of the topside oxide film 206a.

As shown in FIG. 9A, the topside oxide film 206a on the control gate electrode 205 is reduced from the shape before cleaning indicated by the broken line in the figure so that each of the thickness and the width thereof is smaller.

Thereafter, in the step shown in FIG. 9B, an oxide film for forming the sidewall is deposited on the substrate and is then etched back by anisotropic etching to form the oxide film sidewall 206b on the side surfaces of the stack cell electrodes 211 and the on-gate protective film 206a. The oxide film sidewall 206b thereby formed is thinner in its portion Redge located above the upper end edge of the control gate electrode 205.

In the step shown in FIG. 9C, a tungsten silicide film is deposited on the substrate and contact pads 207 are formed by patterning from the tungsten silicide film. Further, interlayer insulating film 209 is deposited on the substrate, contact holes are formed through interlayer insulating film 209 so that they can reach the contact pad 207, and tungsten plugs 208 are formed so as to fill the contact holes. At this time, since the portion of the oxide film sidewall 206a is thinner, there is a possibility of the insulation withstand voltage between the contact pad 207 and the control gate electrode 205 being reduced.

In particular, in the nonvolatile semiconductor memory device having stack cell electrodes, because the upper end edge of the control gate electrode 205 to which a high voltage is applied is acute, and has electric field concentrated thereon electric breakdown can occur easily at the corresponding portion Redge, so that the reliability of the semiconductor device is low.

To solve this problem, the method of increasing the film thickness of the oxide film sidewall 206b may be used. However, if the film thickness of the oxide film sidewall 206b is reduced, the area of contact between the source or drain region 202a or 202b and the contact pad 207 deposited between the adjacent pair of the groups of stack cell electrodes 211 is reduced, resulting in an increase in the contact resistance between the source and drain regions 202a and 202b.

SUMMARY OF THE INVENTION

An object of the present invention is to provide a method of manufacturing a stack-type nonvolatile semiconductor memory device including a memory cell transistor having contacts formed between groups of stack cell electrodes in a self-alignment manner to be connected to source and drain regions, the method enabling the semiconductor device to have a higher insulation withstand voltage by using a means for limiting the reduction in thickness of a portion of the insulating film between the contact pad and the control gate electrode.

To achieve the above-described object, according to the present invention, there is provided a method of manufacturing a semiconductor device including a memory cell transistor having stack cell electrodes, the method including a step (a) of forming on a semiconductor substrate in turn from bottom to top, a gate insulating film, a first conductor film, an intermediate insulating film, and a second conductor film, a step (b) of implanting ions of an impurity in the second conductor film, a step (c) of depositing a protective insulating film on the second conductive film after the step (b), a step (d) of performing, after the step (c), a heat treatment for activating the impurity implanted in the second conductor film; a step (e) of performing, after the step (d), patterning in turn the protective insulating film, the second conductor film, the intermediate insulating film and the first conductor on one film and on another to form the stack cell electrodes consisting of a floating gate electrode, an interlayer capacitor film and a control gate electrode, and an on-gate protective film in turn from bottom to top, a step (f) of forming an impurity diffusion layer in the semiconductor substrate by implantation of ions of an impurity with the stack cell gate electrode used as a mask, a step (g) of depositing an insulating film for a sidewall on the substrate and then performing anisotropic etching on the insulating film to form the sidewall on side surfaces of the stack cell electrode and the topside protective film, and a step (h) of forming a conductor contact adjacent to the sidewall, the conductor contact reaching the impurity diffusion layer.

According to this method, the density of the protective insulating film after the step (d) is high. Therefore the etching resistance of the protective insulating film at the time of removal and cleaning of a resist film in the patterning process of the stack cell electrode in the step (e) and the cleaning of the substrate surface in the step (g) is improved. An undesirable change in the shape of the on-gate protective insulating film is thereby limited, so that the reduction in thickness of the sidewall formed in the step (g) at the upper end edge of the control gate electrode is limited, thereby suitably sufficiently maintaining the insulation withstand voltage between a conductor contact the control gate electrode.

The temperature at which the heat treatment is performed in step (d) is set to such a point that the protective insulating film is densified, thereby further improving the etching resistance of the on-gate protective film.

Preferably, the heat treatment in the step (d) is performed in an inert atmosphere.

Preferably, in the step (c), a silicon oxide film is deposited as the protective insulating film.

If the above-described semiconductor device further has a peripheral circuit region including a MISFET, the step (a) is such that the first conductor film and the intermediate insulating film are formed in turn from bottom to top in the peripheral circuit region, the portions of the first conductor film and the intermediate insulating film located in the peripheral circuit region are then removed, and the gate insulating film and the second conductor film are thereafter formed in the peripheral circuit region; the step (b) is such that ions of the impurity are also implanted in a portion of the second conductor film located in the peripheral circuit region; the step (c) is such that the protective insulating film is also deposited on the portion of the second conductor film located in the peripheral circuit region; the step (e) is such that the portions of the second conductor film and the protective insulating film located in the peripheral circuit region are left; and the step (h) is such that a film of the conductor material is also deposited on the protective insulating film remaining in the peripheral circuit region. In this case, the method further comprises, after the step (h), a step of removing the protective insulating film in the peripheral circuit region, and performing patterning on the second conductor film to form a gate electrode of the MISFET. Thus, the semiconductor device having the memory cell region and the peripheral circuit region can be formed while the process steps are simplified.

Preferably, in such a case, the impurity implanted by ion implantation in step (b) is an n-type impurity.

DETAILED DESCRIPTION OF THE INVENTION EMBODIMENT

FIGS. 1A to 8B are cross-sectional views showing steps in a process for manufacturing a nonvolatile semiconductor memory device in an embodiment of the present invention.

The embodiment of the present invention will be described with respect to a method of manufacturing a stack-type nonvolatile semiconductor memory device which is arranged to be realized as a semiconductor device having a low operating voltage and capable of operating at a high speed in such a manner that a high-performance metal-insulator-semiconductor field-effect transistor (MISFET) is provided in a peripheral circuit region and stack cell electrodes are provided in a memory cell transistor. "Stack-type nonvolatile semiconductor memory device" refers to a semiconductor memory device having a memory cell transistor having stack cell electrodes including a floating gate electrode, an ONO capacitor film and a control gate electrode, such as those described above as electrodes of the conventional semiconductor device. "High-performance MISFET" refers to a CMOS device of a dual gate structure in which different impurity atoms are respectively implanted in gate electrodes of NMISFET and PMISFET to enable low-voltage operation.

In each of FIGS. 1A to 8B, a memory cell region Rmemo is shown in the section on the left-hand side of the broken line, and a peripheral circuit region Rperi on the right-hand side of the broken line.

Figure 1A:
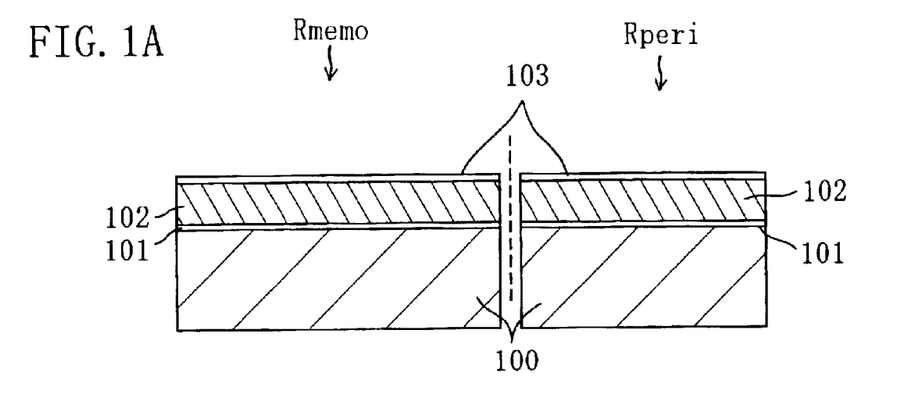
FIGS. 1A, 1B, and 1C are cross-sectional views showing a step of depositing a second conductor film and preceding steps in a process for manufacturing a semiconductor device according to an embodiment of the present invention.

First, in the step shown in FIG. 1A, a tunnel insulating film 101 formed of a silicon oxide film and having a film thickness of 12 nm is formed on the surface of a silicon substrate 100 by thermal oxidation. The tunnel insulating film may be a silicon oxynitride film formed by introducing nitrogen into a silicon oxide film.

A first polysilicon film 102 having a thickness of about 200 nm is deposited on the tunnel insulating film 101 by chemical vapor deposition (CVD). This film is provided as a floating gate electrode material. This first polysilicon film 102 is an n-type polysilicon film doped with phosphorous.

An ONO film 103 provided as a capacitor film is deposited on the first polysilicon film 102. This ONO film 103 is constituted by three layers: a silicon oxide film having a thickness of 7 nm, a silicon nitride film having a thickness of 7 nm, and a silicon oxide film having a thickness of 7 nm.

Figure 1B:
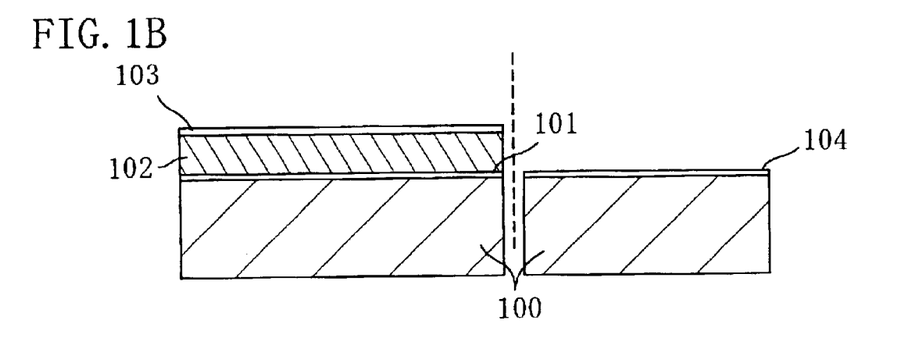

Subsequently, in the step shown in FIG. 1B, a photoresist film (not shown) is formed on the ONO film 103 by photolithography so as to cover the memory cell region Rmemo. Further, patterning on the ONO film 103 and the first polysilicon film 102 is formed by dry etching using this photoresist film as a mask to remove the portion of the film located in the peripheral circuit region Rperi while the portion in the memory cell region Rmemo is left. Thereafter, a surface portion of the silicon substrate 100 exposed in the peripheral circuit region Rperi is oxidized by thermal oxidation to form a 5 nm thick gate oxide film 104 for the MOS transistor.

Figure 1C:
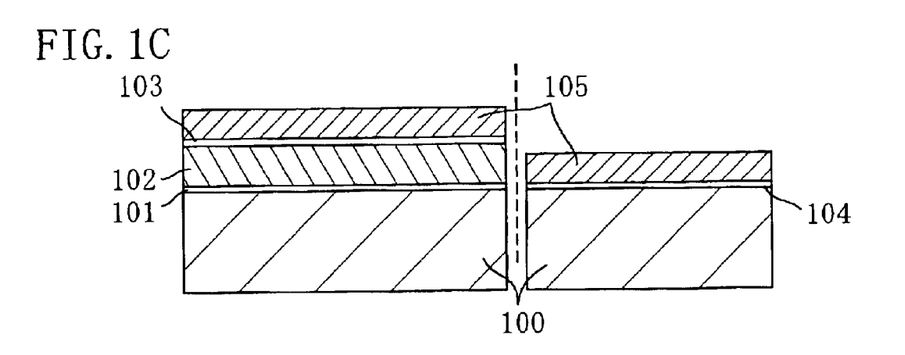

Subsequently, in the step shown in FIG. 1C, a second polysilicon film 105 having a thickness of about 200 nm is formed on the substrate. From this second polysilicon film 105, a control gate of the memory cell transistor and a gate electrode of each MISFET in the CMOS device are formed.

Figure 2A:
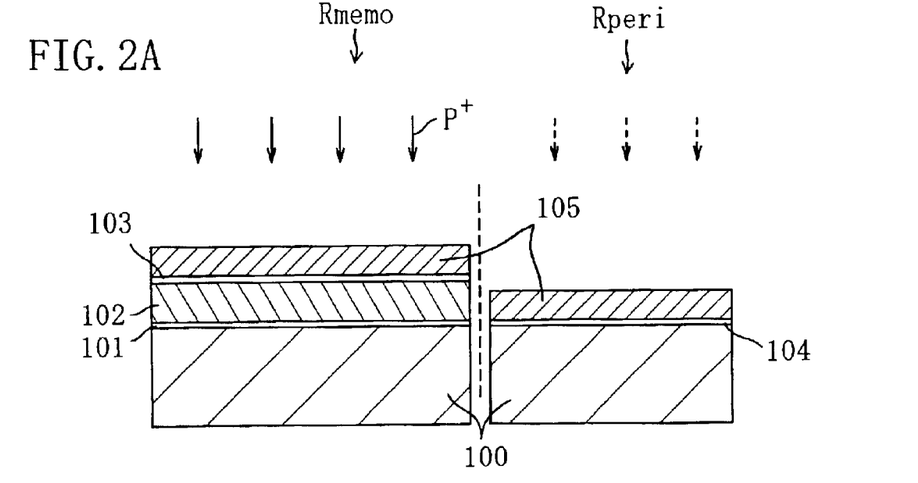
FIGS. 2A, 2B, and 2C are cross-sectional views showing a step of ion implantation in the second conductor film to a step of depositing a protective insulating film in the process for manufacturing the semiconductor device according to the embodiment of the present invention.

In the step shown in FIG. 2A, phosphorous ions ($P^+$) are implanted in the portion of the second polysilicon film 105 located in the memory cell region Rmemo and the portion of the polysilicon film 105 located in the NMISFET region in the peripheral circuit region Rperi to form the CMOS device having dual gate electrodes in the peripheral circuit region Rperi.

Ordinarily, in CMOS devices of the dual gate structure, phosphorous ions ($P^+$) or arsenic ions ($As^+$) are implanted in the gate electrode of the NMISFET while boron ions ($B^+$ or $BF_2^+$) are implanted in the gate electrode of the PMISFET. At this stage, however, boron ion implantation in the portion of the second polysilicon film 105 located in the PMISFET is not performed for reasons described below.

There is a need to perform a heat treatment for activating impurity atoms implanted in the second polysilicon film 105 so that the impurity atom contribute to the electrical conductivity of the gate electrode. However, boron atoms under a heat treatment have a high diffusion speed in the polysilicon film and therefore can easily pass through the gate oxide film to reach the silicon substrate 100. Boron atoms reaching the silicon substrate 100 may adversely affect electrical characteristics. For example, a reduction in threshold voltage of the PMISFET may result. Also, boron in the gate electrode is sufficiently activated by a heat treatment performed to activate the source and drain regions of the MISFETs. Therefore there is a need to avoid unnecessary heating after boron has been introduced into the polysilicon film. Consequently, boron ion implantation is performed as late as possible.

Figure 2B:
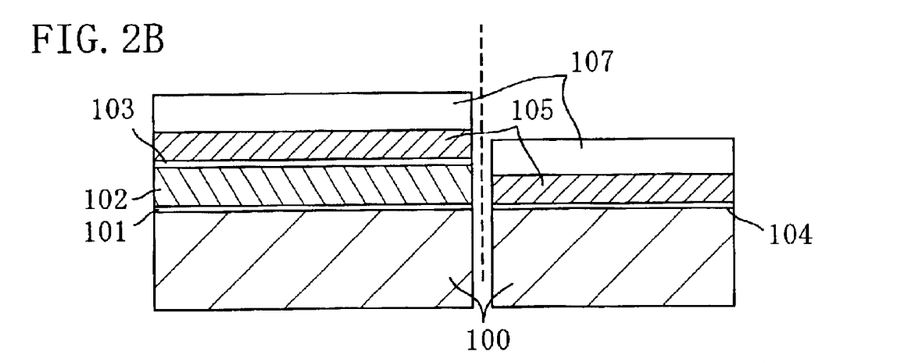

In the step shown in FIG. 2B, a 250 nm thick silicon oxide film 107 for protection of the upper surface is deposited on the substrate by CVD. A silicon nitride film may be deposited as an insulating film on the stack cell electrodes. However, a silicon nitride film may cause a stress in the silicon substrate to reduce the reliability of the memory cell. Therefore it is desirable to form a silicon oxide film as topside protective film on the stack cell electrodes.

Subsequently, in the step shown in FIG. 2C, a heat treatment 108 for activating phosphorous atoms implanted in the second polysilicon film 105 is performed. This activation heat treatment is performed in an inert gas or nitrogen atmosphere at 900° C. for 30 minutes. This activation heat treatment also has a bake compaction effect, i.e., the effect of densifying the silicon oxide film 107.

Conventionally, the heat treatment for activating impurities (phosphorous in particular) implanted in the polysilicon film is performed immediately after implantation. According to the present invention, this heat treatment is performed after deposition of the silicon oxide film 107 to densify the silicon oxide film 107.

By this activation heat treatment also having a densifying effect, the reduction in insulation withstand voltage between the stack cell electrodes and the contact pad, which is considerably large in the conventional art, can be limited. That is, the silicon oxide film 107 formed by CVD is lower in density than thermally oxidized film. Therefore the silicon oxide film 107 as-deposited is reduced by a plurality of cleaning steps. However, the silicon oxide film 107 is densified by the heat treatment for activating impurities, so that the reduction in the size of the silicon oxide film 107 caused by cleaning in subsequent steps can be limited. That is, the shape of the on-gate protective film indicated by the broken line in FIG. 9A can be maintained to prevent a reduction in thickness of the sidewall film described below, thus limiting the reduction in insulation withstand voltage between the stack cell electrodes and the compact pad.

Figure 3A:
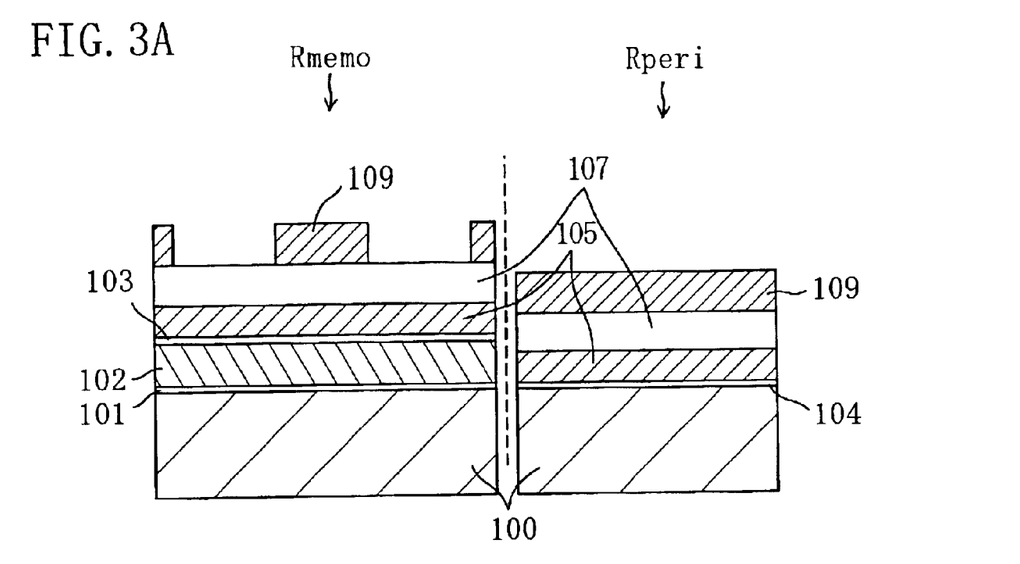
FIGS. 3A and 3B are cross-sectional views showing a step of forming a resist film for stack cell electrode patterning to a step of forming stack cell electrodes in the process for manufacturing the semiconductor device according to the embodiment of the present invention.

In the step shown in FIG. 3A, a resist film 109 for forming the stack cell electrodes is formed on the silicon oxide film 107 by photolithography.

Figure 3B:
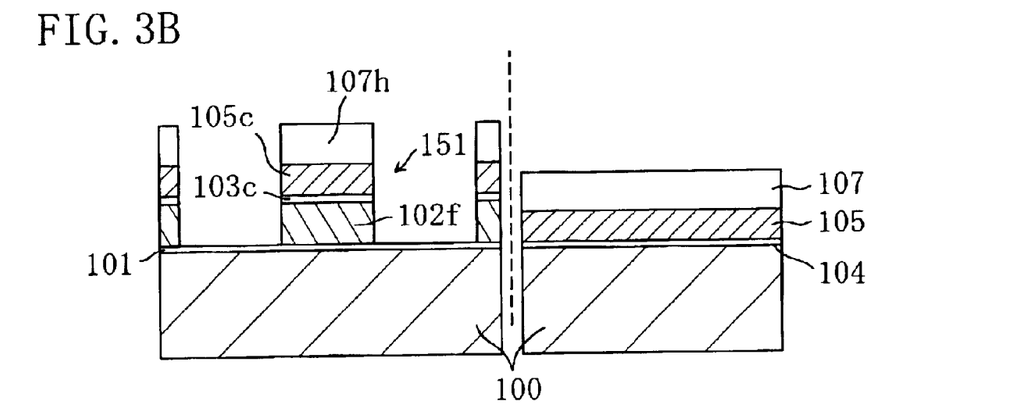

In the step shown in FIG. 3B, patterning is performed on the silicon oxide film 107, the first polysilicon film 102, the ONO film 103 and the second polysilicon film 105 in the memory cell region Rmemo by dry etching using the resist film 109 as a mask to form a floating gate electrode 102f, an ONO capacitor film 103c and a control gate electrode 105c as stack cell electrodes 151, and topside protective film 107h. The resist film 109 is thereafter removed. At this time, both the second polysilicon film 105 and the silicon oxide film 107 remain in the peripheral circuit region Rperi.

In the steps shown in FIGS. 3A and 3B, etching is continuously performed on the silicon oxide film 107, the second polysilicon film 105, the ONO film 103 and the first polysilicon film 102 in the memory cell region Rmemo by using the resist film 109 as a mask. This step may alternatively be such that patterning is first performed only on the silicon oxide film 107 in the memory cell region Rmemo to form the topside protective film 107h, the resist film 109 is then removed, and patterning is performed on the second polysilicon film 105, the ONO film 103 and the first polysilicon film 102 by using the topside protective film 107f as a mask. Stack cell electrodes 151 can also be formed in this manner. In the case of etching using the topside protective film 107h as a mask, however, the topside protective film 107h formed of silicon oxide film is also etched and there is a possibility that the topside protective film 107h cannot have a rectangular shape such as shown in FIG. 3B, as described below.

When the second polysilicon film 105 is etched, etching is performed under such conditions that the topside protective film 107h formed of silicon oxide film is not etched while the polysilicon film is selectively etched. Ordinarily, the etching selection ratio between silicon oxide film and polysilicon film is comparatively large. However, the topside protective film 107h formed of silicon oxide film is also etched slightly. Further, the ONO film 103 is constituted by silicon nitride film and two silicon oxide films between which the nitride film is sandwiched. The conditions for etching of the upper and lower two silicon oxide films are substantially equal to those for etching of the on-gate protective film 107h. During etching of the ONO film 103, therefore, the on-gate protective film 107h is etched to the extent corresponding to the film thickness of the upper and lower layers of the ONO film 103. The on-gate protective film 107h is also etched to some extent during etching of the first polysilicon film 102, as well as during etching of the second polysilicon film 105.

As described above, if the on-gate protective film 107h formed of silicon oxide film is used as a hard mask for etching, there is a possibility of the sectional configuration of the on-gate protective film 107h being changed from the desired rectangular shape. This means the risk of the portion of the oxide film sidewall formed afterward, corresponding to the upper edge of the control gate electrode 105c, being reduced in thickness to cause a considerable reduction in insulation withstand voltage, as in the case of the conventional art.

Therefore, from the viewpoint of limiting the undesirable change in shape of the on-gate protective film 107h, it is desirable to perform patterning for forming stack cell electrodes 151 by using the resist film 109 as a mask.

Figure 4A:
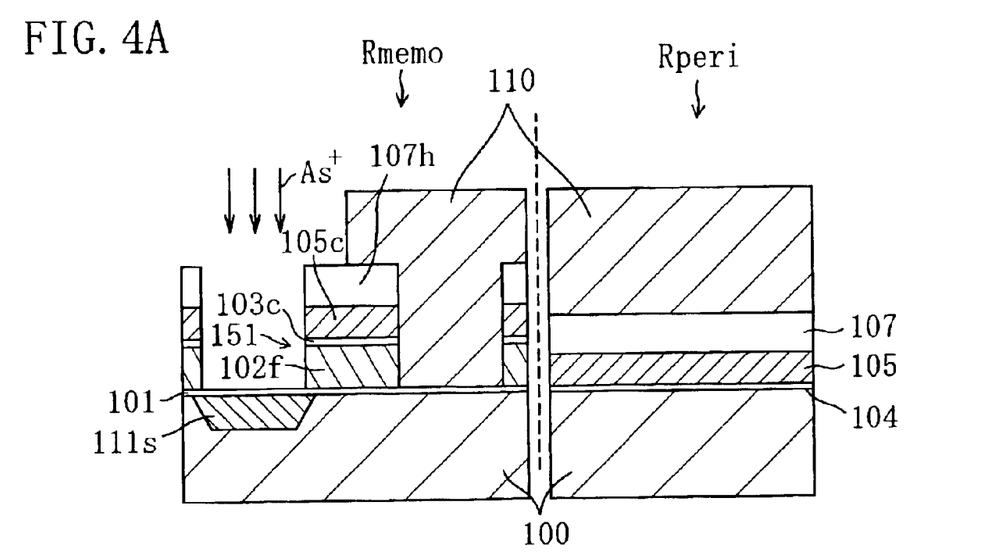
FIGS. 4A and 4B are cross-sectional views showing steps of respectively forming source and drain regions of a memory cell transistor in the process for manufacturing the semiconductor device according to the embodiment of the present invention.

In the step shown in FIG. 4A, a resist film 110 opened above the region where the source region of the memory cell transistor is to be formed is formed on the substrate, and arsenic ions (As$^+$) are implanted in the silicon substrate 100 with the resist film 110 used as a mask, thereby forming a source region 111s. Resist removal cleaning is thereafter performed to remove the resist film 110. For this resist removal cleaning, cleaning with a sulfuric acid-hydrogen peroxide solution and cleaning with an ammonia-hydrogen peroxide solution are continuously performed. A sulfuric acid-hydrogen peroxide solution has substantially no etching effect on the silicon substrate and the silicon oxide film but is effective in etching and removing organic materials including the resist film. An ammonia-hydrogen peroxide solution has a small etching effect on the silicon substrate and the silicon oxide film and is effective in removing particles, metallic contaminants, organic contaminants, etc. During cleaning with an ammonia-hydrogen peroxide solution in resist removable cleaning for removal of contaminants or the like, therefore, the shape of the on-gate protective film 107h is changed from the desired shape.

Figure 4B:
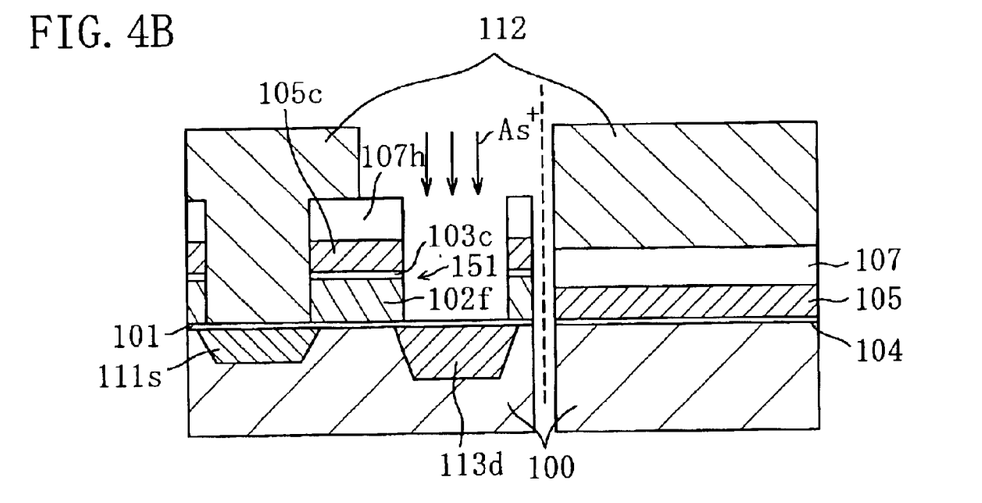

Thereafter, in the step shown in FIG. 4B, a resist film 112 opened above the region where the drain region of the memory cell transistor is to be formed is formed on the substrate, and arsenic ions (As$^+$) are implanted in the silicon substrate 100 with the resist film 112 used as a mask, thereby forming a drain region 113d. Resist removal cleaning is thereafter performed to remove the resist film 112.

Figures 5A, 5B:
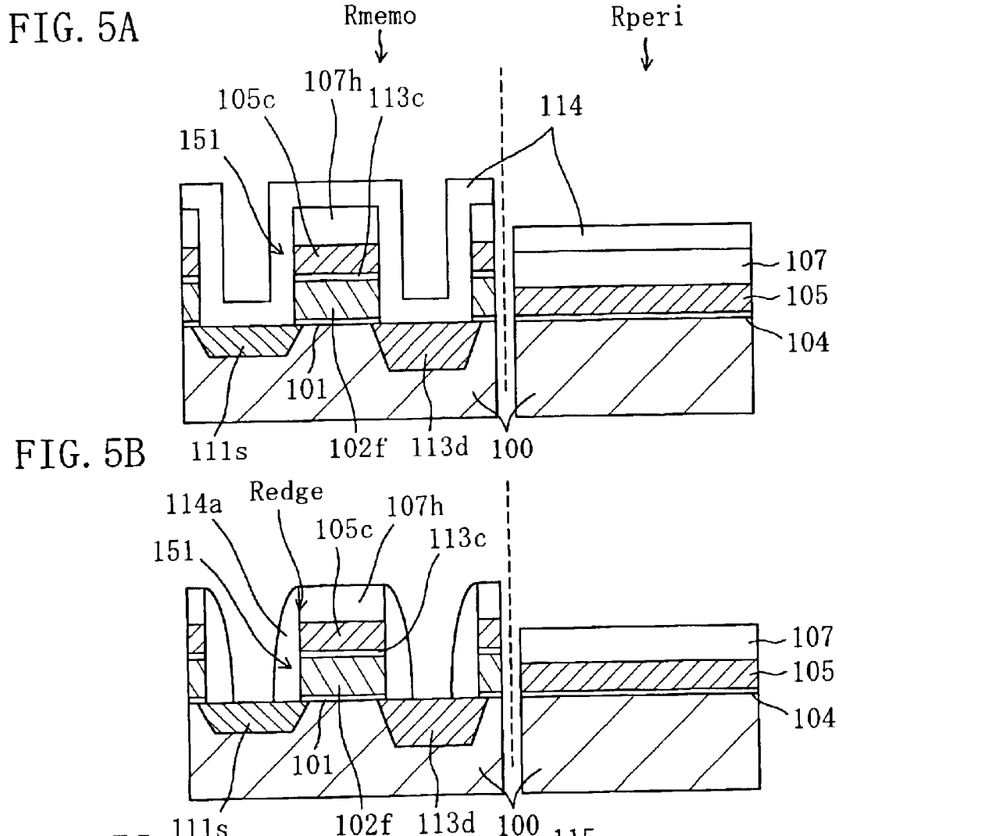
FIGS. 5A, 5B, and 5C are cross-sectional views showing a step of forming a sidewall insulating film to a step of forming source and drain contacts and a bard mask insulating film in the process for manufacturing the semiconductor device according to the embodiment of the present invention.

In the step shown in FIG. 5A, a 120 nm thick silicon oxide film 114 is deposited on the substrate by CVD to form the sidewall on the stack cell electrodes 151. This silicon oxide film 114 is, for example, a tetraethyl orthosilicate (TEOS) film. Ordinarily, pre-CVD cleaning is performed before this CVD step to remove contaminants from the substrate surface. This pre-CVD cleaning is cleaning with an ammonia-hydrogen peroxide solution or the like effective in removing contaminants.

As described above, a plurality of cleaning operations are performed before the sectional configuration of the memory cell transistor shown in FIG. 4B is obtained, i.e., between the formation of the source and drain regions 111s and 111d and deposition of the silicon oxide film 114. Each of these cleaning operations includes cleaning for removing impurities from the substrate surface. The silicon oxide film 107h deposited by CVD is etched to a small extent. After the completion of the plurality of cleaning operations, therefore, the on-gate protective film 107h is etched so that the shape thereof is changed (from the desired shape).

In this embodiment, however, the on-gate protective film 107h is densified when the heat treatment for activating the impurities in the dual gate electrodes is performed. Therefore, even if a picture taking substrate cleaning operations are performed for separation of the resist films, etc., the extent to which the on-gate protective film 107h formed of the densified silicon oxide film is extremely small and the change in shape is effectively limited.

Thereafter, in the step shown in FIG. 5B, the silicon oxide film 114 is etched back by anisotropic etching to form an oxide film sidewall 114a on the side surfaces of the stack cell electrodes 151 and the on-gate protective film 107h. Thus, the upper surface and the side surface of the stack cell electrodes 151 are covered with the on-gate protective film 107h and the sidewall 114b. At this stage, the total amount of etching of the on-gate protective film 107h on the control gate 105c is substantially zero, and the on-gate protective film 107h has a generally rectangular shape such as that indicated by the broken line in FIG. 9A. Therefore, a reduction in thickness such as shown in FIG. 9B is not caused in the oxide film sidewall 114a at the upper end edge Redge of the control gate electrode 105c.

Figure 5C:
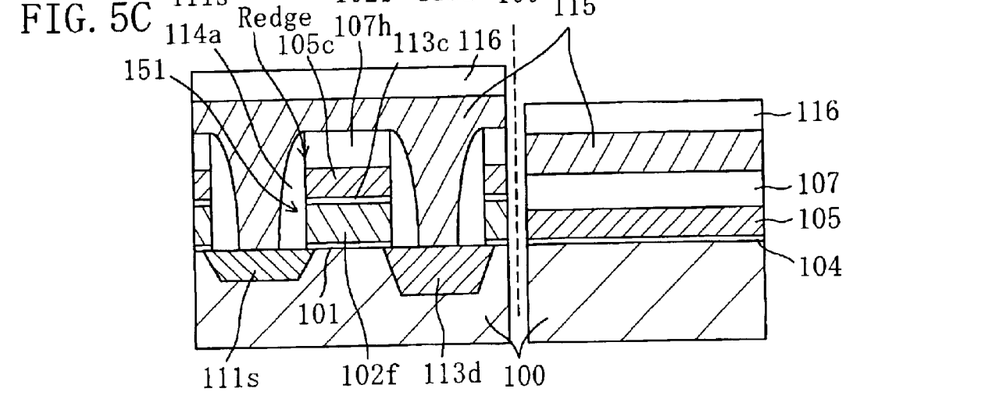

In the step shown in FIG. 5C, a third polysilicon film 115 provided as a material for source and drain electrodes is deposited on the substrate so that the spaces between the adjacent pairs of the groups of stack cell electrodes 151 are filled with the third polysilicon film 115. Subsequently, a 100 nm thick silicon oxide film 116 is deposited on the third polysilicon film 115 by CVD. At this time, third polysilicon film 115 and silicon oxide film 116 are also deposited in the peripheral circuit region Rperi.

Figure 6A:
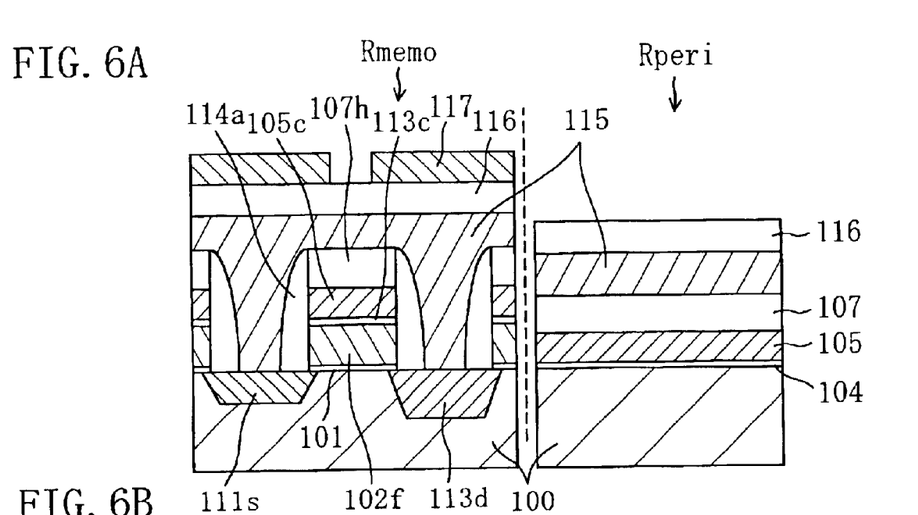
FIGS. 6A, 6B, and 6C are cross-sectional views showing a step of forming a resist film for patterning for source and drain contacts to a step of patterning for forming the source and drain contacts in the process for manufacturing the semiconductor device according to the embodiment of the present invention.
Figure 6B:
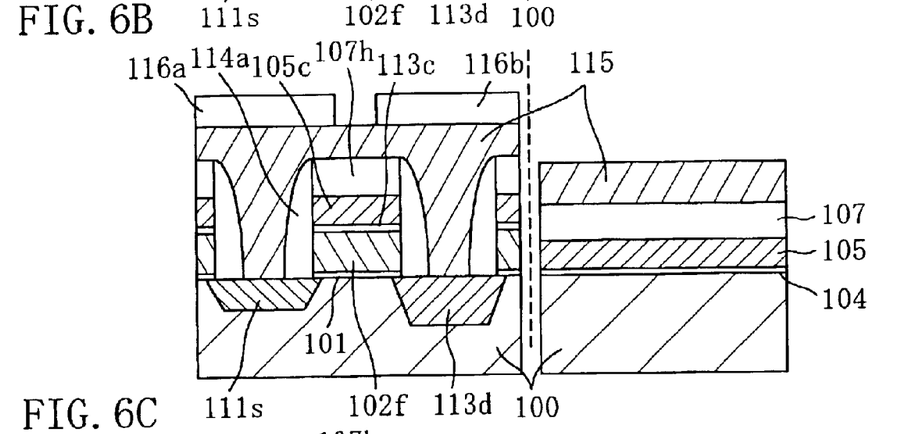

In the step shown in FIG. 6A, a resist film 117 for source/drain contact patterning is formed on the substrate. In the step shown in FIG. 6B, patterning is performed on the silicon oxide film 116 by anisotropic dry etching to form a hard mask 116b formed of silicon oxide film. At this time, the silicon oxide film 116 deposited in the peripheral circuit region Rperi is removed by etching to expose the surface of the third polysilicon film 115.

Figure 6C:
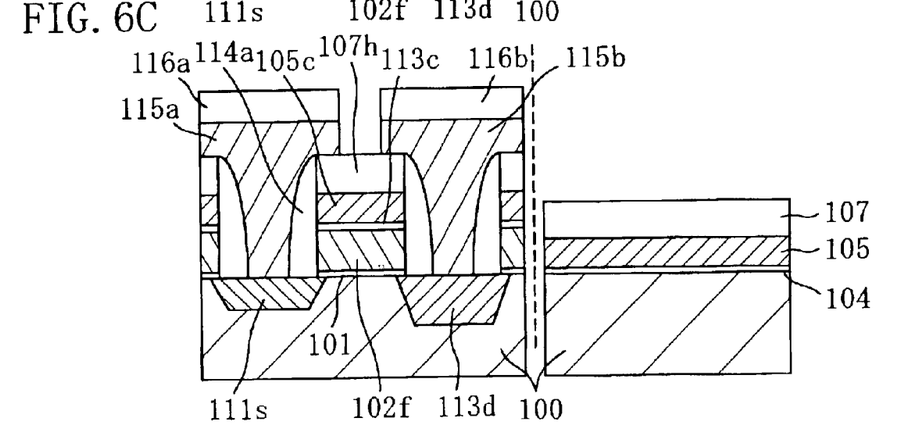

In the step shown in FIG. 6C, patterning is performed on the third polysilicon film 115 by dry etching using the hard mask 116b to form source and drain contacts 115a and 115b in the memory cell region Rmemo. On the other hand, the entire third polysilicon film 115 in the peripheral circuit region Rperi is removed.

Figure 7A:
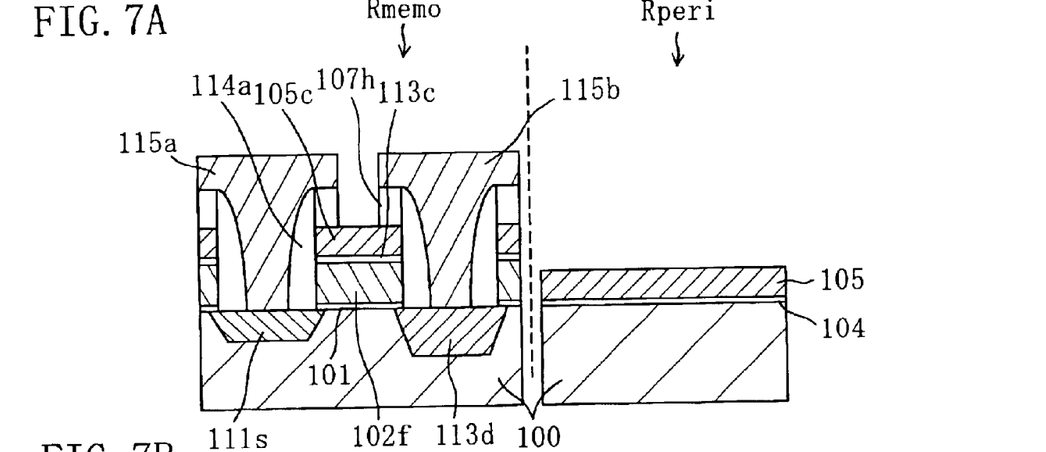
FIGS. 7A, 7B, and 7C are cross-sectional views showing a step of forming an opening at a portion of a control gate electrode to a step of forming a gate electrode in a peripheral circuit region in the process for manufacturing the semiconductor device according to the embodiment of the present invention.

In the step shown in FIG. 7A, to form the MISFET in the peripheral circuit region Rperi, the silicon oxide film 107 in the peripheral circuit region Rperi is removed by etching and the hard mask 116b in the memory cell region Rmemo is also removed. At this time, the portions of the topside protective film 107h exposed in the openings of the source and drain contacts 115a and 115b are also etched so that the surface of the control electrode 105c is exposed. Thereafter, boron ions ($B^+$, $BF_2^+$) are implanted in the portion of the PMISFET for forming the gate electrode in the second polysilicon film 105 in the peripheral circuit region Rperi.

Figure 7B:
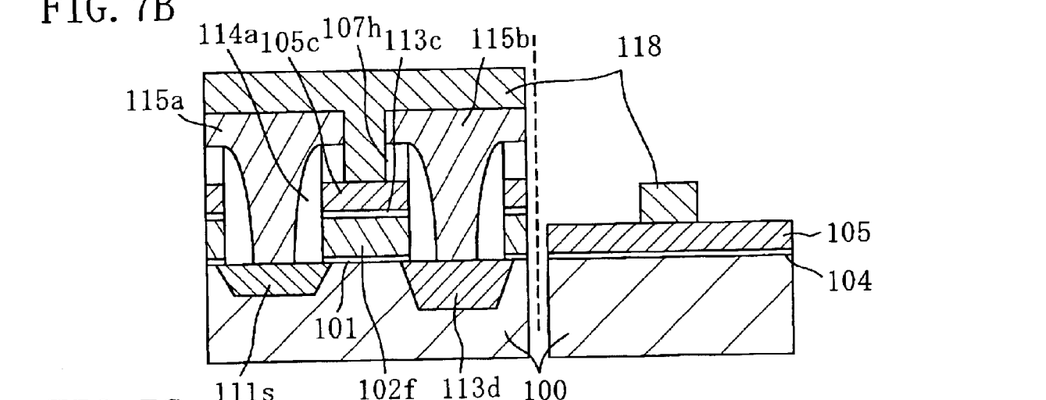
Figure 7C:
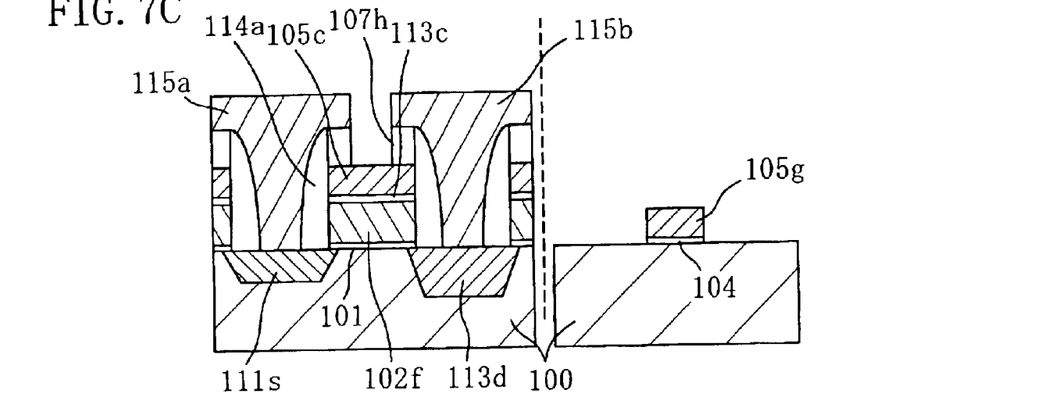

In the step shown in FIG. 7B, a resist film 118 is formed on the substrate by photolithography. In the step shown in FIG. 7C, patterning is performed on the second polysilicon film 105 by dry etching using the resist film 118 as a mask to form a gate electrode 105g of the MISFET in the peripheral circuit region Rperi.

Figure 8A:
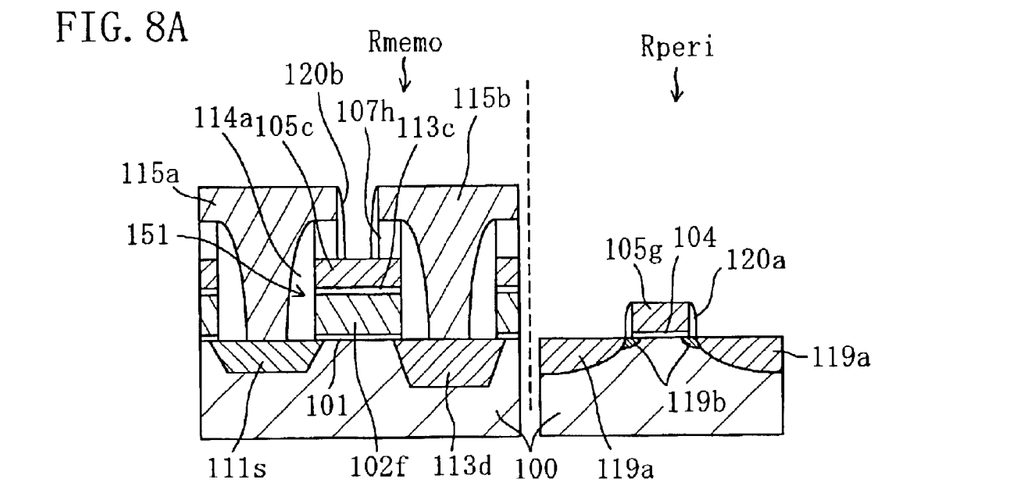
FIGS. 8A and 8B are cross-sectional views showing a step of forming a sidewall on gate electrode side surfaces to a step of forming a silicide layer in the process for manufacturing the semiconductor device according to the embodiment of the present invention.

In the step shown in FIG. 8A, removal and cleaning of the resist film 118 are performed and the NMISFET and PMISFET in the peripheral circuit region Rperi are formed by using a well-known technique. This step does not relate to the features of the present invention and therefore will not be described in detail. Only the resulting structure of the MISFET is illustrated in FIG. 8A. That is, the MISFET (NMISFET or PMISFET) has the gate electrode 105g, a sidewall 120a formed on the side surfaces of the gate electrode 105g, a lightly doped drain (LDD) region (or extension region) 119b formed by ion implantation using a gate electrode 105g as a mask, and source and drain regions 119a formed by ion implantation using the gate electrode 105g and the sidewall 120a as a mask after the formation of the sidewall 120a. At the time of formation of the sidewall 120a in the peripheral circuit region Rperi, sidewalls 120b are also formed on side surfaces of the source and drain contacts 115a and 115b in the memory cell region Rmemo.

Figure 8B:
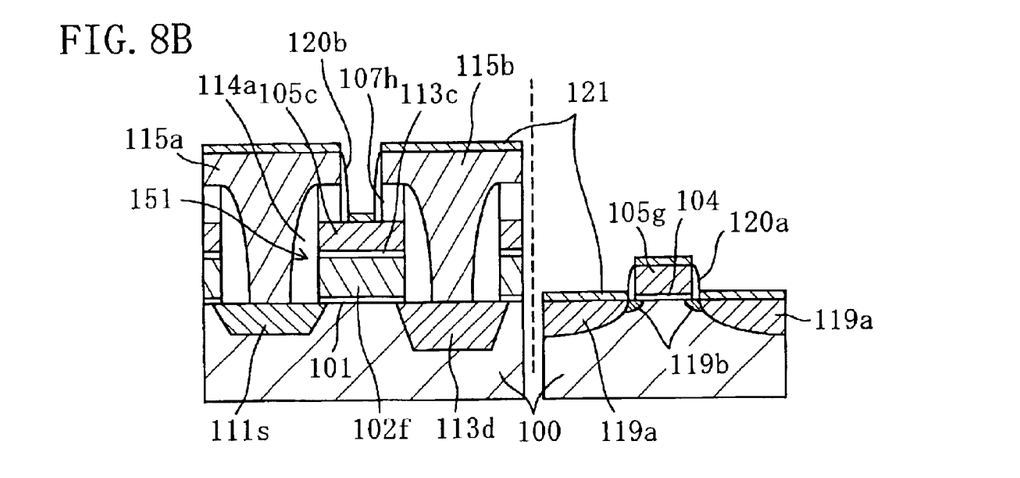

In the step shown in FIG. 8B, a silicide layer 121 is formed on the exposed portions of the gate electrode 105g and the source and drain regions 119a of the MISFET, the source and drain contacts 115a and 115b and the control gate electrode 105c in the memory cell region Rmemo to reduce the sheet resistance.

The stack-type nonvolatile semiconductor memory device is thereby completed in the memory cell region Rmemo.

Figure 2C:
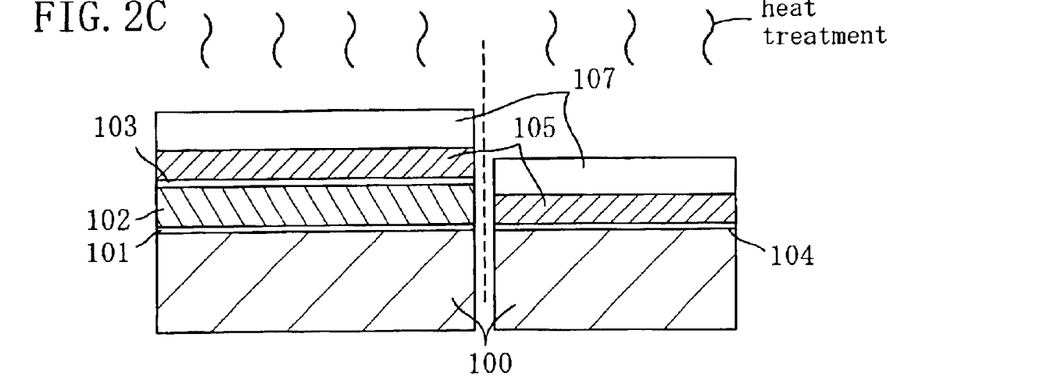

According to the manufacturing method of this embodiment, the silicon oxide film 107 from which on-gate protective film formed on the control gate electrode 105c undergoes bake compaction in the heat treatment in the step shown in FIG. 2C, and the on-gate protective film 107h is thereafter formed from the silicon oxide film 107. Thus, the on-gate protective film 107h is formed in the steps shown in FIGS. 3A and 3B after being densified. Therefore the on-gate protectively film 107h has improved etching resistance and the suitable shape of the on-gate protectively film 107 is maintained even after the step for removing resist film 109 and cleaning, and after the cleaning step performed before deposition of the silicon oxide film for the oxide film sidewall shown in FIG. 5A. That is, in the conventional manufacturing process, the silicon oxide film for the on-gate protective film is deposited after the heat treatment for activating impurities implanted in the second polysilicon film, and forming resist films, forming the on-gate protective film and the stack cell electrodes, forming the oxide film sidewall, etc., are thereafter performed. Therefore an undesirable change in the shape of the on-gate protective film results.

In contrast, according to the manufacturing method of the present invention, the thickness of the oxide film sidewall 114 is not reduced at the upper end edge Redge of the control gate electrode 105 in the step shown in FIG. 5B. Therefore the insulation withstand voltage between each of the source and drain contacts 115a and 115b and the control gate electrode 150c can be maintained at a high level in the finished state shown in FIG. 8B.

In particular, according to the manufacturing method of the present invention, the silicon oxide film 107 is densified in the step shown in FIG. 2C by a treatment having a bake compaction effect as well as the effect of activating the impurities implanted in the second polysilicon film 105. Thus, the manufacturing process can be simplified.

While in this embodiment the contact pads shown in FIG. 10 are not formed, the same effect of the present invention can also be achieved even in a case where compact pads are formed.

What is claimed is:

1. A method of manufacturing a semiconductor device including a memory cell transistor having stack cell electrodes, said method comprising:
   a step (a) of forming on a semiconductor substrate in turn from bottom to top, a gate insulating film, a first conductor film, an intermediate insulating film, and a second conductor film;
   a step (b) of implanting ions of an impurity in the second conductor film;
   a step (c) of depositing a protective insulating film on the second conductor film after said step (b);
   a step (d) of performing, after said step (c), a heat treatment for activating the impurity implanted in the second conductor film;
   a step (e) of performing, after said step (d), patterning in turn the protective insulating film, the second conductor film, the intermediate insulating film and the first conductor film to form the stack cell electrodes consisting of a floating gate electrode, an interlayer capacitor film and a control gate electrode, and an on-gate protective film in turn from bottom to top;
   a step (f) of forming an impurity diffusion layer in the semiconductor substrate by implantation of ions of an impurity with the stack cell gate electrode used as a mask;
   a step (g) of depositing an insulating film for a sidewall on the substrate and then performing anisotropic etching on the insulating film to form the sidewall on side surfaces of the stack cell electrode and the topside protective film; and
   a step (h) of forming a conductor contact adjacent to the sidewall, the contact reaching the impurity diffusion layer.

2. The method according to claim 1, wherein the temperature at which the heat treatment is performed in said step (d) is set to such a point that the protective insulating film is densified.

3. The method according to claim 1, wherein the heat treatment in said step (d) is performed in an inert atmosphere.

4. The method according to claim 1, wherein, in said step (c), a silicon oxide film is deposited as the protective insulating film.

5. The method according to claim 1, wherein the semiconductor device also has a peripheral circuit region including a MISFET;

in said step (a), the first conductor film and the intermediate insulating film are formed in turn from bottom to top in the peripheral circuit region, the portions of the first conductor film and the intermediate insulating film located in the peripheral circuit region are then removed, and the gate insulating film and the second conductor film are thereafter formed in the peripheral circuit region;

in said step (b), ions of the impurity are also implanted in a portion of the second conductor film located in the peripheral circuit region;

in said step (c), the protective insulating film is also deposited on the portion of the second conductor film located in the peripheral circuit region;

in said step (e), the portions of the second conductor film and the protective insulating film located in the peripheral circuit region are left; and in said step (h), a film of the conductor material is also deposited on the protective insulating film remaining in the peripheral circuit region, and said method further comprising, after said step (h), a step of removing the protective insulating film in the peripheral circuit region, and performing patterning on the second conductor film to form a gate electrode of the MISFET.

6. The method according to claim 5, wherein the impurity implanted by ion implantation in said step (b) is an n-type impurity.

7. A method of manufacturing a semiconductor device including a memory cell transistor having stack cell electrodes, said method comprising:

a step (a) of forming on a semiconductor substrate in turn from bottom to top, a first conductor film, an intermediate insulating film, and a second conductor film;

a step (b) of depositing a protective insulating film on the second conductor film after said step (a);

a step (c) of performing, after said step (b), a heat treatment for activating an impurity in the second conductor film;

a step (d) of performing patterning in turn the protective insulating film, the second conductor film, the intermediate insulating film and the first conductor film to form the stack cell electrodes consisting of a floating gate electrode, an interlayer capacitor film and a control gate electrode, and an on-gate protective film in turn from bottom to top; and a step (e) of forming a sidewall on side surfaces of the stack cell electrode.

8. The method according to claim 7, wherein the temperature at which the heat treatment is performed in said step (c) is set to such a point that the protective insulating film is densified.

9. The method according to claim 7, wherein the heat treatment in said step (c) is performed in an inert atmosphere.

10. The method according to claim 7, wherein, in said step (b), a silicon oxide film is deposited as the protective insulating film.

11. The method according to claim 7, wherein said step (d) is performed after said step (c).

12. The method according to claim 7, wherein, in said step (e), the sidewall is formed on side surfaces of the topside protective film.

* * * * *